(12) United States Patent
Wu et al.

(10) Patent No.: US 9,779,848 B2
(45) Date of Patent: Oct. 3, 2017

(54) FLAT CABLE WITH CONSISTENT IMPEDANCE

(71) Applicant: HON HAI PRECISION INDUSTRY CO., LTD., New Taipei (TW)

(72) Inventors: Jerry Wu, Irvine, CA (US); Jun Chen, Kunshan (CN); Fan-Bo Meng, Kunshan (CN)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 135 days.

(21) Appl. No.: 14/476,974

(22) Filed: Sep. 4, 2014

(65) Prior Publication Data
US 2015/0060117 A1 Mar. 5, 2015

(30) Foreign Application Priority Data
Sep. 4, 2013 (CN) .......................... 2013 1 0394847

(51) Int. Cl.
| | |
|---|---|
| H05K 1/03 | (2006.01) |
| H01B 1/02 | (2006.01) |
| H01B 7/08 | (2006.01) |
| H05K 1/02 | (2006.01) |
| H05K 1/11 | (2006.01) |

(52) U.S. Cl.
CPC ............ *H01B 1/02* (2013.01); *H01B 7/0861* (2013.01); *H05K 1/0224* (2013.01); *H05K 1/118* (2013.01); *H05K 2201/09245* (2013.01)

(58) Field of Classification Search
CPC ...... H01B 1/02; H01B 7/0861; H05K 1/0224; H05K 1/118; H05K 2201/09245

USPC ....... 174/255, 250, 251, 254, 257, 258, 261, 174/267, 268, 72 R
See application file for complete search history.

(56) References Cited

U.S. PATENT DOCUMENTS

| | | | |
|---|---|---|---|
| 7,804,028 B2 | 9/2010 | Chin et al. | |
| 7,807,927 B2 | 10/2010 | Yeh et al. | |
| 2008/0047734 A1* | 2/2008 | Hock ................... | H01B 7/0876 174/112 |
| 2012/0181060 A1 | 7/2012 | Chen et al. | |

FOREIGN PATENT DOCUMENTS

CN 101441905 A 5/2009

* cited by examiner

*Primary Examiner* — Tremesha S Willis
(74) *Attorney, Agent, or Firm* — Wei Te Chung; Ming Chieh Chang

(57) ABSTRACT

A flat cable (100) includes an insulative carrier (20) extending along a front-to-back direction, a set of signal conductors (10) held by the insulative carrier, and a metal grid layer (30) attached to the insulative carrier. The insulative carrier has a top face facing upwardly and a bottom face facing downwardly. The insulative carrier defines a set of receiving passageways (210) disposed along a transverse direction perpendicular to the front-to-back direction. The set of signal conductors extend along the front-to-back direction and have different pitches along the transverse direction. The metal grid layer is attached to the top face or the bottom face. The metal grid layer has different densities along the front-to-back direction in order to make the impedance of the flat cable consistent along the front-to-back direction.

20 Claims, 4 Drawing Sheets

FLAT CABLE WITH CONSISTENT IMPEDANCE

BACKGROUND OF THE INVENTION

1. Field of the Invention

The present invention relates to a flexible flat cable, and more particularly to a flexible flat cable which has a shielding effect and matches characteristic impedance of an electrical connector.

2. Description of Related Art

U.S. Pat. No. 7,804,028, issued on Sep. 28, 2010, discloses a flexible flat cable to be applied in electrical connectors, including an insulative carrier extending along a front-to-back direction, an insulated base layer, a metal grid layer arranged on the insulated base layer which is attached to the insulative carrier, and a set of signal conductors sandwiched between the insulative carrier and the combined metal grid layer and insulated base layer. The set of signal conductors has a same pitch between every two adjacent signal conductors along the front-to-back direction. The metal grid layer is arranged uniformly in meshed arrangement. The flexible flat cable is generally able to match characteristic impedance of an electrical connector.

A flat cable having consistent impedance is desired.

SUMMARY OF THE INVENTION

Accordingly, an object of the present invention is to provide a flat cable having consistent impedance.

In order to achieve the object set forth, the invention provides a flat cable including an insulative carrier extending along a front-to-back direction, a set of signal conductors held by the insulative carrier, and a metal grid layer attached to the insulative carrier. The insulative carrier has a top face facing upwardly and a bottom face facing downwardly. The insulative carrier defines a set of receiving passageways disposed along a transverse direction perpendicular to the front-to-back direction. The signal conductors extend along the front-to-back direction and have different pitches along the transverse direction. The metal grid layer is attached to the top face or the bottom face. The metal grid layer has different densities along the front-to-back direction in order to make the impedance of the flat cable consistent along the front-to-back direction.

Other objects, advantages and novel features of the invention will become more apparent from the following detailed description when taken in conjunction with the accompanying drawings.

DETAILED DESCRIPTION OF THE PREFERRED EMBODIMENT

Reference will now be made in detail to the preferred embodiment of the present invention.

Figure 1:
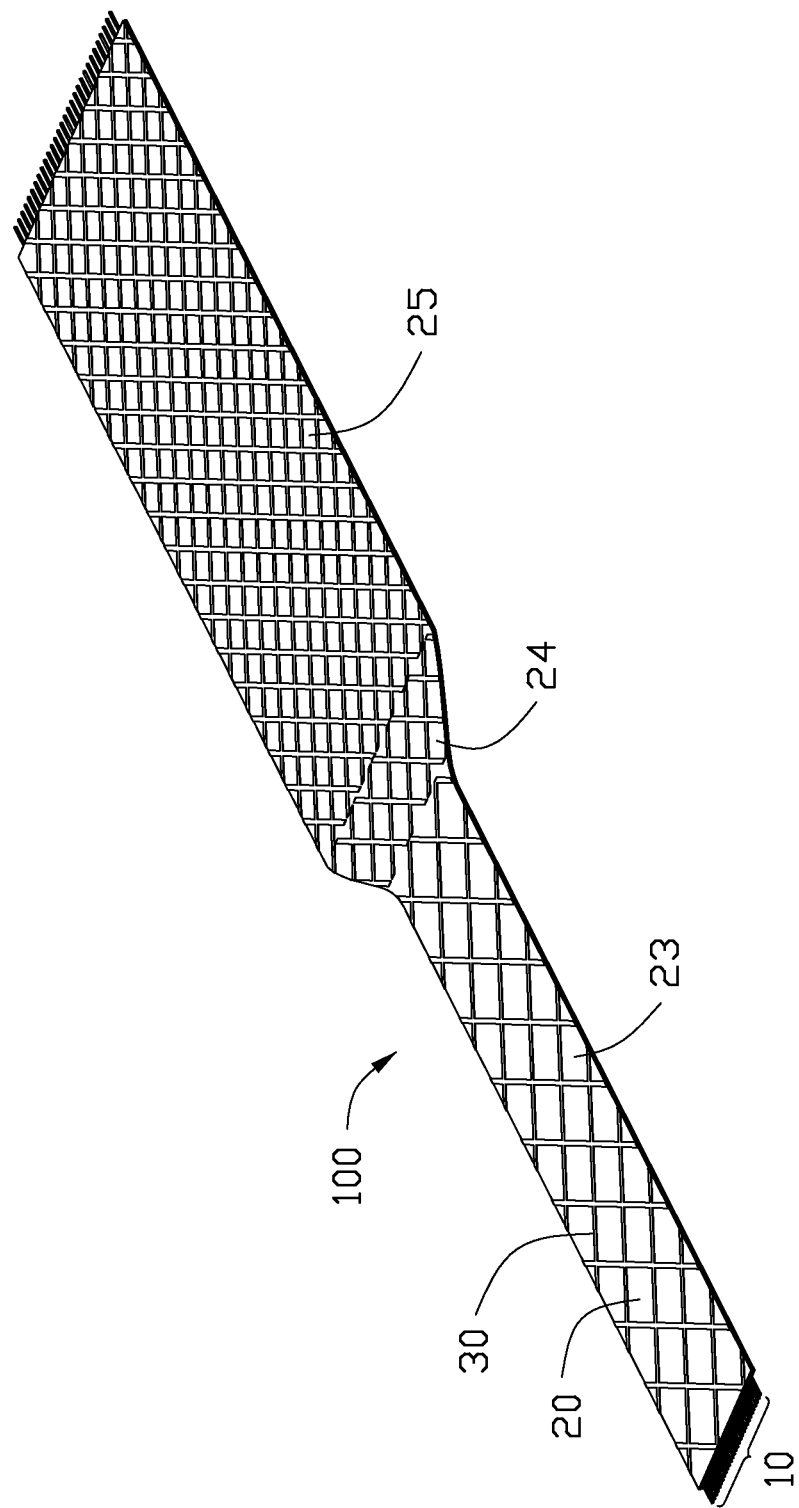
FIG. 1 is a perspective view of a flat cable according to the present invention.
Figure 2:
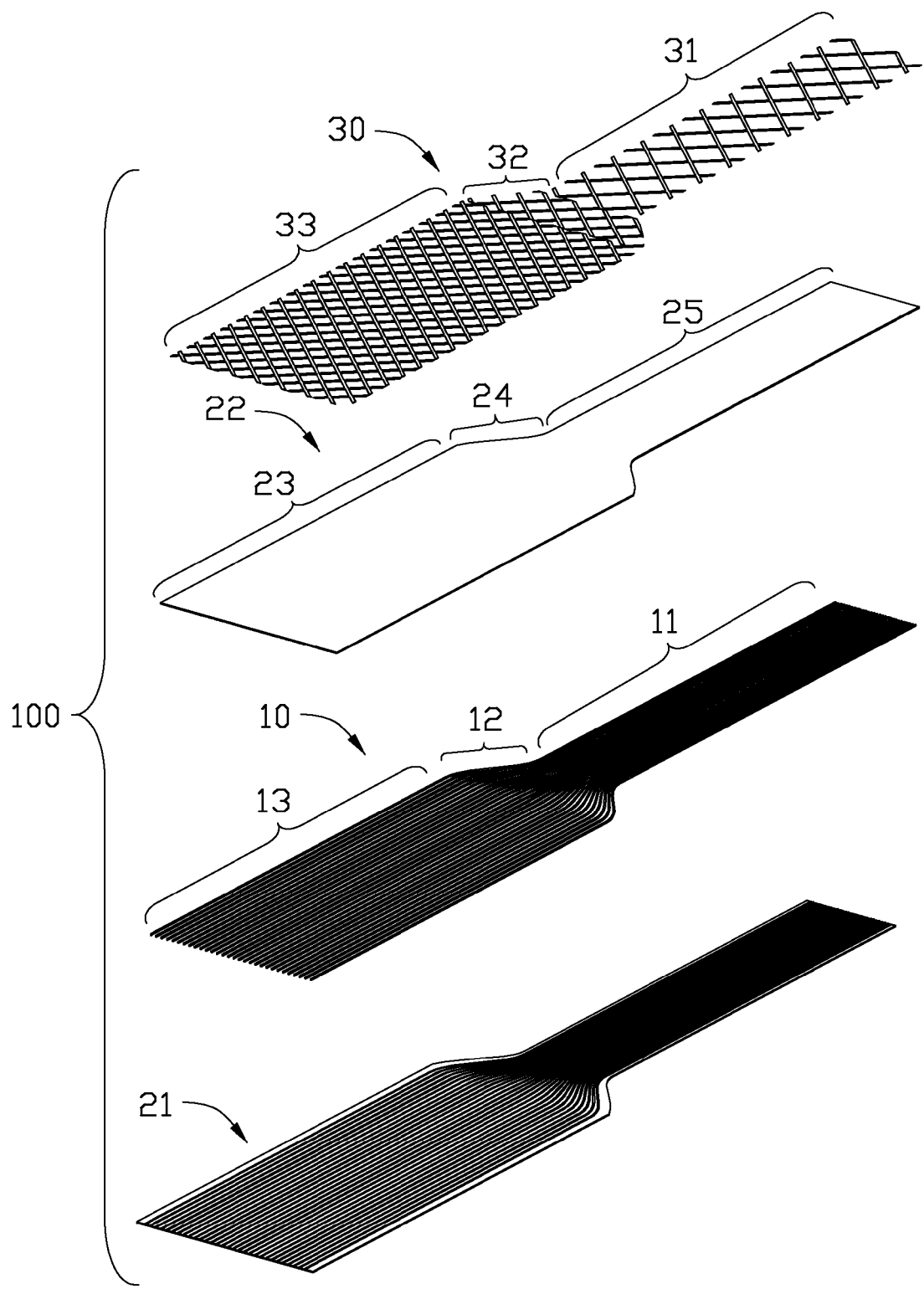
FIG. 2 is an exploded view of the flat cable shown in FIG. 1.
Figure 3:
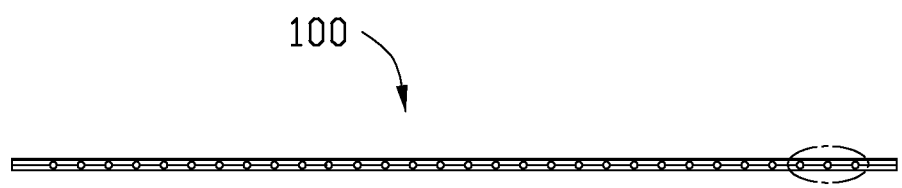
FIG. 3 is front view of the flat cable shown in FIG. 1.
Figure 4:
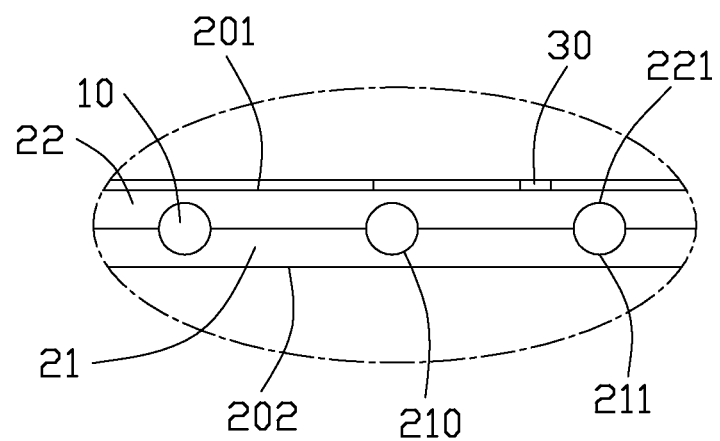
FIG. 4 is an enlarged view of a circled portion of the flat cable shown in FIG. 3.

Referring to FIGS. 1-4, a flat cable 100 according to the present invention is shown. The flat cable 100 includes an insulative carrier 20, a set of signal conductors 10 held by the insulative carrier 20, and a metal grid 30 attached to the insulative carrier 20. The insulative carrier 20 extends along a front-to-back direction.

The set of signal conductors 10 are arranged side by side in a transverse direction perpendicular to the front-to-back direction. The impedance of the signal conductors 10 changes along the front-to-back direction. In order to meet the needs of connecting different devices, the signal conductors 10 have different impedance along the front-to-back direction through setting different pitches of the signal conductors along the transverse direction. The set of signal conductors 10 provide a dense area 11, a transition area 12, and a loose area 13 disposed along a back-to-front direction. The impedance of the dense area 11 is greater than that of the transition area 12. The impedance of the transition area 12 is greater than that of the loose area 13. Each signal conductor 10 is a cylindrical conductive wire. The set of signal conductors 10 are parallel to each other and respectively equally spaced in the dense area 11 and the loose area 13. The set of signal conductors 10 respectively extend linearly in the dense area 11 and the loose area 13 along the front-to-back direction.

The insulative carrier 20 includes a first insulative carrier 21 with a semicircle passageway 211 and a second insulative carrier 22 with the other semicircle passageway 221. The two semicircle passageway 211, 221 are assembled together to form the receiving passageway 210. Each signal conductor 10 is received in corresponding receiving passageway 210. The first and second insulative carriers 21, 22 are assembled together to hold the set of signal conductors 10. The first and second insulative carriers 21, 22 are bonded together by a thermo-compression bonding process. The insulative carrier 20 includes a front portion 23 corresponding to the loose area 13, a middle portion 24 corresponding to the transition area 12, and a rear portion 25 corresponding to the dense area 11. The width of the front portion 23 is larger than that of the middle portion 24. The width of the middle portion 24 is larger than that of the rear portion 25.

The insulative carrier 20 has a top face 201 facing upwardly and a bottom face 202 facing downwardly. The metal grid layer 30 is attached to the top face 201 or the bottom face 202 of the first insulative carrier 21. The metal grid layer 30 provides a sparse region 31 attached to the rear portion 25, a dense region 33 attached to the front portion 23, and an extended region 32 attached to the middle portion 24. The density of the sparse region 31 is less than that of the extended region 32. The density of the extended region 32 is less than that of the dense region 33. The metal grid layer 30 has different densities along the front-to-back direction in order to make the impedance of the flat cable 100 consistent along the front-to-back direction. The metal grid layer 30 contains silver material. The metal grid layer 30 is constituted of a plurality of diamond-shaped grids. The metal grid layer 30 is formed on the insulative carrier 20 by continuous printing.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the members in which the appended claims are expressed.

What is claimed is:

1. A flat cable comprising:
an insulative layer with a plurality of flexible conductors embedded therein in a vertical direction and extending along a front-to-back direction perpendicular to said vertical direction, said conductors being arranged with two different pitches, which are measured in a transverse direction perpendicular to both said vertical direction and said front-to-back direction, in two different areas along said front-to-back direction, a same smaller pitch among all said plurality of flexible conductors at one of the two different areas being different from a same larger pitch among all said plurality of flexible conductors at the other of the two different areas; and
a metallic grid layer in a mesh pattern discrete from the flexible conductors and applied upon at least one of opposite surfaces of said insulative layer; wherein
said metallic grid layer defines thereof different densities corresponding to said different areas in a relational manner with regard to the pitches so as to maintain a generally consistent impedance of the whole cable in said front-to-back direction.

2. The flat cable as claimed in claim 1, wherein the area with the same larger pitch is equipped with a lower density of the metallic grid layer while the area with the same smaller pitch is equipped with a higher density of the metallic grid layer.

3. The flat cable as claimed in claim 2, wherein the area with the same larger pitch is wider than that with the same smaller pitch in the transverse direction.

4. The flat cable as claimed in claim 1, wherein said insulative layer is essentially composed of opposite upper and lower half layers tightly sandwiching said conductors therebetween in said vertical direction.

5. The flat cable as claimed in claim 4, wherein the upper half layer and the lower half layer have same material thereof.

6. The flat cable as claimed in claim 4, wherein each of said conductors forms a circular cross-section instead of a rectangular one.

7. The flat cable as claimed in claim 1, wherein another area is located between said two different areas, and a density of said metallic grid layer in said another area is amounted between those in said two different areas in a variable transitional manner.

8. A flat cable comprising:
an insulative layer with a plurality of flexible conductors embedded therein in a vertical direction and extending along a front-to-back direction perpendicular to said vertical direction, said conductors being arranged with two different pitches, which are measured in a transverse direction perpendicular to both said vertical direction and said front-to-back direction, in two different areas along said front-to-back direction, a same larger pitch among all said plurality of flexible conductors at one of the two different areas being different from a same smaller pitch among all said plurality of flexible conductors at the other of the two different areas; and
a metallic grid layer in a mesh pattern discrete from said flexible conductors and applied upon at least one of opposite surfaces of said insulative layer; wherein
said metallic grid layer defines thereof different electrical characteristics, either in a horizontal plane defined by said front-to-back direction and said transverse direction, or in said vertical direction, and said different electrical characteristics correspond to said different areas in a relational manner with regard to the pitches so as to maintain a generally consistent impedance of the whole cable in said front-to-back direction.

9. The flat cable as claimed in claim 8, wherein said different electrical characteristics result from a density change rather than a height change.

10. The flat cable as claimed in claim 9, wherein each of said conductors forms a circular cross-section.

11. The flat cable as claimed in claim 7, wherein said another area is of a trapezoid.

12. The flat cable as claimed in claim 8, wherein in said two different areas, the area having the same larger pitch has a larger transverse dimension than that area having the same smaller pitch in the transverse direction.

13. The flat cable as claimed in claim 8, wherein another area is located between said two different areas, and a density of said metallic grid layer in said another area is amounted between those in said two different areas in a variable transitional manner.

14. The flat cable as claimed in claim 13, wherein said another area defines a trapezoidal configuration.

15. A flat cable comprising:
an insulative carrier extending along a front-to-back direction, the insulative carrier having a top face facing upwardly and a bottom face facing downwardly, the insulative carrier defining a set of receiving passageways disposed along a transverse direction perpendicular to the front-to-back direction;
a set of signal conductors received in the receiving passageways respectively, the signal conductors extending from a first end of the insulative carrier along the front-to-back direction to a second end of the insulative carrier, and having different pitches along the transverse direction at the first and second ends among said set of signal conductors; and
a metal grid layer attached to the top face or the bottom face and arranged in a mesh manner; wherein
the metal grid layer has different densities along the front-to-back direction.

16. The flat cable as claimed in claim 15, wherein said signal conductors are disposed side by side along the transverse direction, and the set of signal conductors provide a dense area, a loose area, and a transition area according to the different pitches between said signal conductors.

17. The flat cable as claimed in claim 16, wherein the insulative carrier includes a front portion corresponding to the loose area, a middle portion corresponding to the transition area, and a rear portion corresponding to the dense area, a transversal width of the front portion is larger than a transversal width of middle portion, and the transversal width of the middle portion is larger than a transversal width of the rear portion.

18. The flat cable as claimed in claim 17, wherein said metal grid layer provides a sparse region attached on the dense area, a dense region attached on the loose area, and an extended region attached on the transition area, a density of the sparse region is less than that of the extended region, and a density of the extended region is less than that of the dense region.

19. The flat cable as claimed in claim 16, wherein said set of signal conductors are parallel to each other in the dense area and the loose area and extend linearly along the front-to-back direction.

20. The flat cable as claimed in claim 16, wherein said set of signal conductors are respectively equally spaced in the dense area and the loose area.

* * * * *